United States Patent [19]

Hofmann et al.

[11] 4,104,735
[45] Aug. 1, 1978

[54] ARRANGEMENT FOR ADDRESSING A MOS STORE

[75] Inventors: Rüediger Hofmann, Munich; Paul-Werner Von Basse, Wolfratshausen-Farchet, Germany

[73] Assignee: Siemens Aktiengesellschaft, Berlin & Munich, Germany

[21] Appl. No.: 833,051

[22] Filed: Sep. 14, 1977

Related U.S. Application Data

[63] Continuation-in-part of Ser. No. 825,274, Aug. 17, 1977, and Ser. No. 825,225, Aug. 17, 1977.

[30] Foreign Application Priority Data

Sep. 15, 1976 [DE] Fed. Rep. of Germany ....... 2641524

[51] Int. Cl.$^2$ ............................................. G11C 8/00
[52] U.S. Cl. .................................... 365/230; 307/205; 307/DIG. 5
[58] Field of Search ......... 365/230; 307/205, DIG. 1, 307/DIG. 5

[56] References Cited

U.S. PATENT DOCUMENTS 3,902,082  8/1975  Proebsting et al. .......... 307/DIG. 5

Primary Examiner—Stuart N. Hecker
Attorney, Agent, or Firm—Hill, Gross, Simpson, Van Santen, Steadman, Chiara & Simpson

[57] ABSTRACT

A system is disclosed for addressing a MOS store containing MOS transistor storage cells. Address signals are amplified, inverted and intermediately stored. Negated and non-negated address signals are fed to a decoder circuit connected by drive lines to the storage cells. The decoder circuit selects a drive line depending upon the prevailing address signals. The decoder circuit is provided as a preliminary decoder circuit and a post decoder circuit. The preliminary decoder circuit has a plurality of stages wherein each stage is supplied with address signals in negated and non-negated form. Output lines of the preliminary decoder stages are connected to the post decoder circuit. Drive lines connect the storage cells to the post decoder circuit. Logic linking elements are provided in the post decoder circuit for logic linking these drive lines to the output lines of the preliminary decoder stages.

4 Claims, 7 Drawing Figures

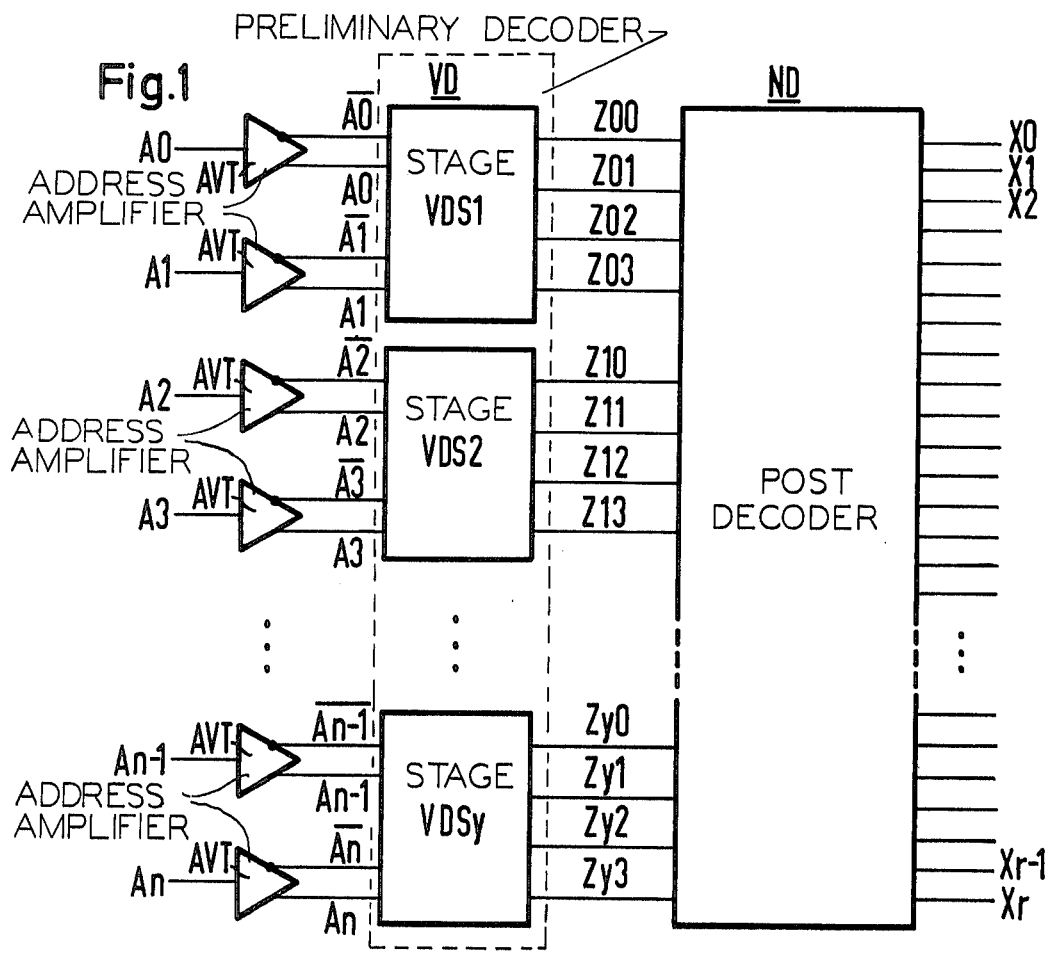
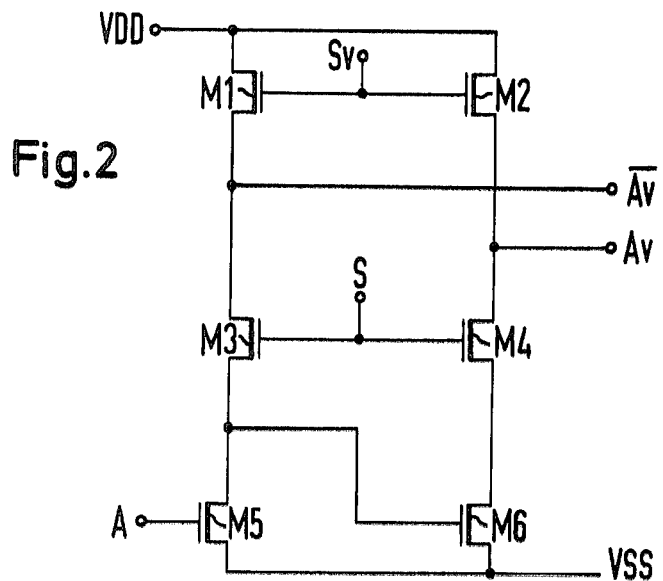

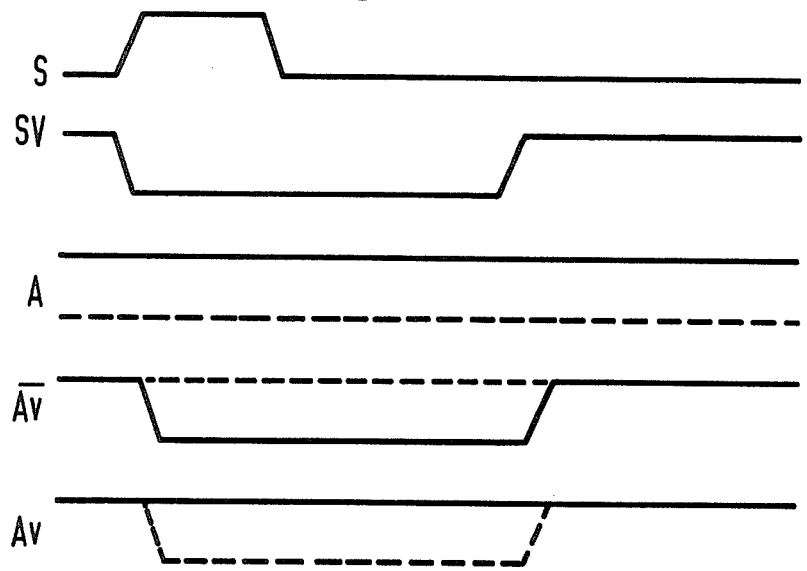
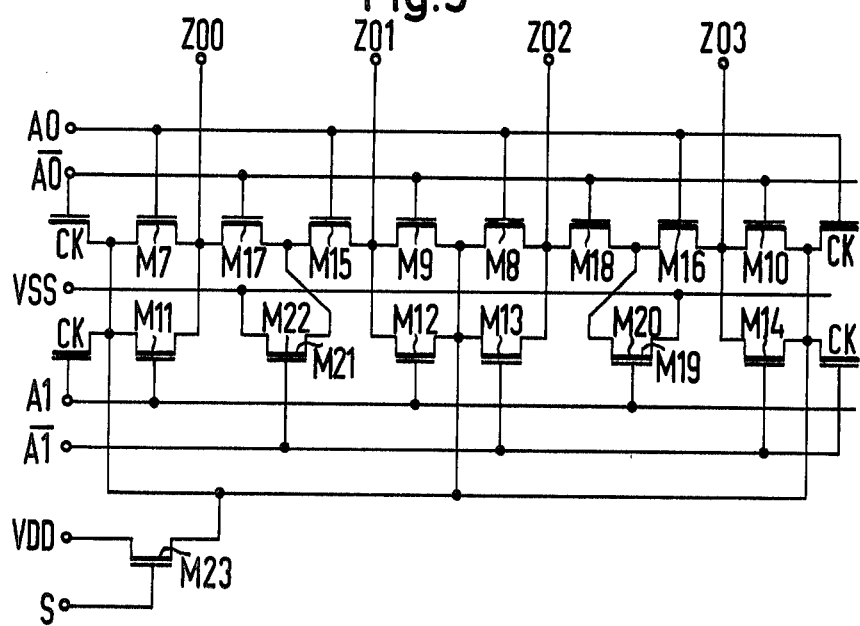

ARRANGEMENT FOR ADDRESSING A MOS STORE

RELATED APPLICATIONS

This application is a continuation-in-part of our earlier filed applications entitled "A Decoder Circuit Arrangement With MOS Transistors" filed on Aug. 17, 1977 as U.S. Ser. No. 825,274 and "A Semiconductor Store" filed on Aug. 17, 1977 as U.S. Ser. No. 825,225.

BACKGROUND OF THE INVENTION

1. Field of the Invention

The invention relates to an arrangement for addressing a MOS store consisting of MOS transistor storage cells, with the aid of address signals, wherein the address signals are amplified, inverted and intermediately stored, and the negated and non-negated address signals are fed to a decoder circuit which is connected to drive lines to the storage cells and which selects a drive line in dependence upon the applied address signals.

2. Description of the Prior Art

Arrangements for the addressing of MOS transistor storage cells are known. Usually the MOS transistor storage cells are combined to form a matrix and each storage cell is operated by a word line and a bit line. If, for example, a storage cell or a series of storage cells is to be selected, it is necessary to select a word and a bit line. This is carried out with the aid of address signals which are fed to an addressing arrangement. An addressing arrangement of this kind contains address buffer circuits which amplify, invert and intermediately store the incoming address signals. The address buffer circuits are then connected to the actual decoder circuit. In dependence upon the prevailing address signal combination, the decoder circuit selects one of the drive lines, thus bit or word lines, leading to the storage cells.

If, for example, a store consisting of storage cells is supplied with $n$ address signals, $2^n$ drive lines can be selected. The $n$ address signals are presented to $n$ address buffer circuits in which the $n$ address signals are negated and intermediately stored. Each address buffer circuit possesses two outputs, one for the negated address signal and one for the non-negated address signal, so that the total number of buffer outputs is $2n$. The $2n$ buffer outputs are connected to the decoder circuit. Here the decoder circuit consists of decoder sub-circuits, each of which is connected to a drive line. The decoder sub-circuits are each constructed from parallel-connected MOS transistors, the so-called decoder transistors, each decoder transistor of a decoder sub-circuit being supplied with the address signal in negated or non-negated form. The function of such decoder sub-circuits is known and therefore does not require to be explained. In decoder sub-circuits constructed in this way, $n$ decoder transistors are required as every decoder sub-circuit is fed with $n$ address signals in negated or non-negated form. The total number of decoder transistors finally amounts to $n$ decoder transistors per decoder sub-circuit times $2^n$ decoder sub-circuits. Thus each of the $2n$ buffer outputs is connected to $2^n/2$ decoder transistors.

Thus if 6 address signals are employed and thus 64 drive lines are provided, $6 \times 2^6$ decoder transistors are required in the decoder circuit. The loading of every buffer output then amounts to 32 decoder transistors. Each increase in the storage capacity results in an increase in drive lines, address signals and decoder transistors. This produces an increase in the capacitive loading of the buffer outputs, but a reduction in the switching speed. In highly integrated storage modules having a high storage density in the cell field, the reduction in the switching speed occurs in that the space available for the decoder transistors in the decoder circuit is limited. Therefore it is only possible to use small decoder transistors with a correspondingly low output current.

SUMMARY OF THE INVENTION

An object of the invention is to provide an arrangement for the addressing of MOS transistor storage cells in a MOS store wherein the number of decoder transistors is reduced. This object is realized in that the decoder circuit consists of a preliminary decoder circuit and a post decoder circuit. The preliminary decoder circuit is constructed from stages and for $n$ address signals each stage is supplied with $m$ different address signals in negated and non-negated form so that $(n/m)$ stages are utilized. Each stage possesses $2^m$ output lines, and that in dependence upon the address signal combinations prevailing at the stages, one of the output lines of each stage is marked. The output lines of the stages connect to a post decoder circuit which has $2^n$ drive lines connected to the storage cells. The post decoder circuit logic links the drive lines by means of logic-linking elements to the output lines of the preliminary decoder stages in such manner that each drive line can be selected by means of a different combination of an output line with respect to each preliminary decoder stage via a logic-linking element. In the event that the $n$ address signals are divisible by $m$ with a remainder, the remaining address signals are fed directly to the post decoder circuit in negated and non-negated form, and the drive lines can be selected by the latter via logic-linking elements.

This division of the overall decoder circuit into a preliminary decoder circuit and a post decoder circuit considerably reduces the number of decoder tansistors connected to an output of an address buffer circuit. If, for example, a 1 from 64 decoder circuit is selected and in the preliminary decoder circuit two address signals in a stage are logic-linked, the post decoder circuit contains only half the number of decoder transistors which are required without preliminary decoding. This leads to a lower capacitive loading of the address buffer circuits. As it is possilbe to economize not only on transistors but also on contact holes, the remaining decoder transistors can be designed to be considerably larger. This in turn allows an increase in the decoding speed.

The logic-linking elements in the post decoder circuit can at least consist of a transistor whose gate is connected to an output line from a stage of the preliminary decoder circuit, and whose controlled path is arranged between a drive line and a fixed potential. Then the transistors assigned to a drive line are connected in parallel by their controlled paths, whereas the gate inputs of these transistors are connected to output lines of different stages of the preliminary decoder circuit. The parallel arrangement of these transistors (in the following referred to as decoder transistors) can be connected in known manner to an output stage which switches through a selector signal to a drive line when none of the decoder transistors is conductive.

The preliminary decoder circuit can consist of $2^m$ NAND gates, where each NAND gate consists of $m$ series connected discharge transistors and $m$ parallel connected charging transistors. The point of connection between the charging transistors and the discharge transistors with respect to each NAND gate forms the output which is connected to the output line. Here the gate terminals of the charging transistors are each supplied with $m$ different address signals in negated or non-negated form, and the gate terminals of the discharge transistors are supplied with these address signals in negated form. With the aid of an additional transistor, the connection point of the selector transistors, which does not constitute the output, can be connected to a fixed potential. Here it is expedient to arrange a coupling capacitor between this connection point and the gate terminals of the charging transistors.

BRIEF DESCRIPTION OF THE DRAWINGS

FIG. 1 is a fundamental block circuit diagram of the decoder circuit in accordance with the invention;

FIG. 2 illustrates an address amplifier in the decoder circuit of FIG. 1;

FIG. 3 is a pulse format associated with the address amplifier of FIG. 2;

FIG. 5 illustrates a stage of the preliminary decoder circuit of FIG. 4 with coupling capacitors;

DESCRIPTION OF THE PREFERRED EMBODIMENTS

Figure 4:
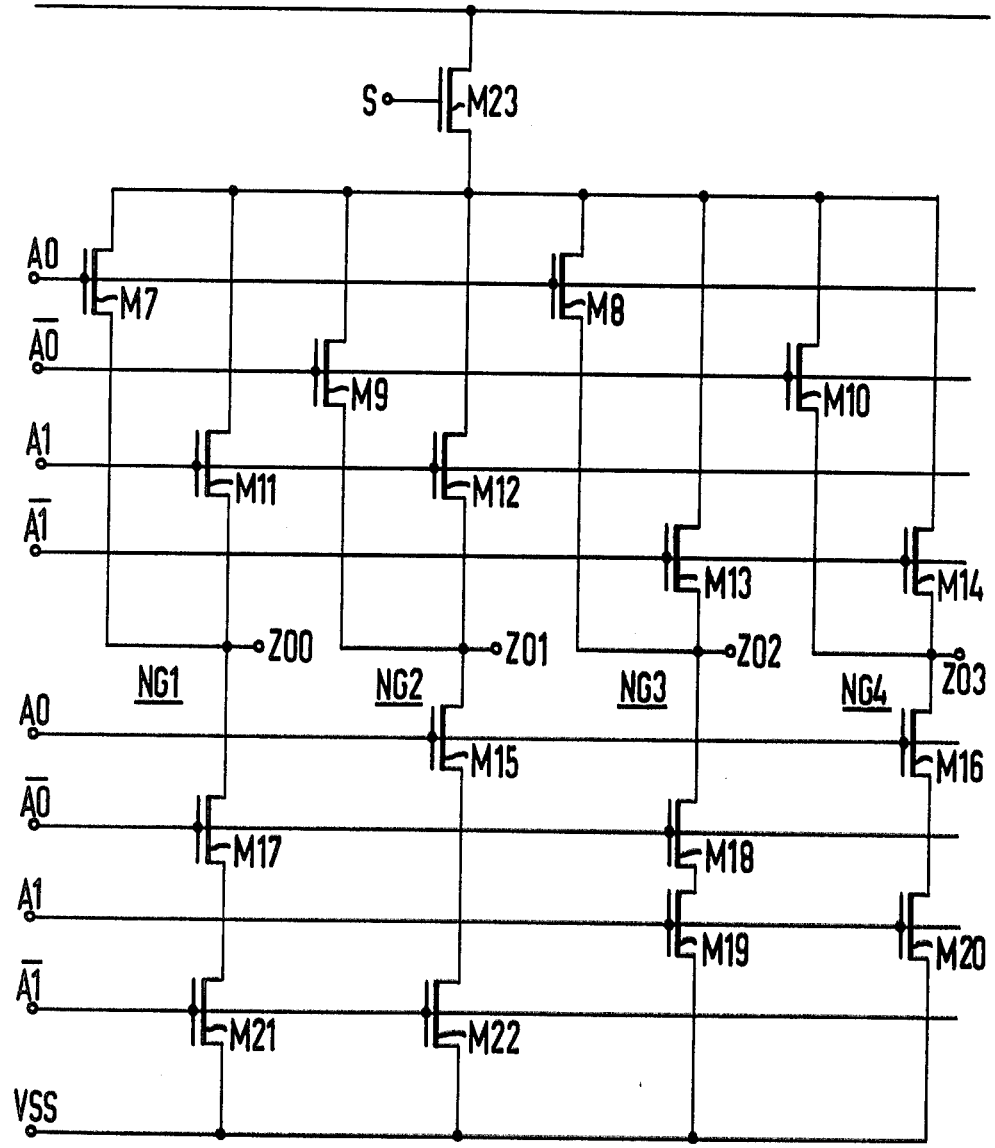
FIG. 4 illustrates a stage of a preliminary decoder circuit illustrated in FIG. 1.

FIG. 1 is a fundamental block circuit diagram of the decoder circuit in accordance with the invention. This consists of a preliminary decoder circuit VD and a post decoder circuit ND. The preliminary decoder circuit VD is constructed from stages VDS1 to VDSY. Here $Y = (n/m)$ where $n$ corresponds to the number of address signals, $m$ to the number of address signals supplied to a stage VDS, and $n$ and $m$ are both whole numbers.

The address signals are referenced A0 to A$n$. They are initially presented to address amplifiers AVT which negate these address signals and intermediately store the negated and non-negated address signals. The negated and non-negated address signals are then fed to the stages VDS of the preliminary decoder circuit VD. In the exemplary embodiment illustrated in FIG. 1, two address signals are each presented to a stage VDS in negated and non-negated form. For example, the stage VDS1 is supplied with the address signals A0 and A1 in negated and non-negated form, the stage VDS2 is supplied with the address signals A2 and A3 in negated and non-negated form, and the stage VDSY is supplied with the address signals A$n$-1 and A$n$ in negated and non-negated form. Each stage VDS of the preliminary decoder circuit VD possesses $2^m$ output lines. As in the exemplary embodiment shown in FIG. 1 whose $m = 2$, each stage VDS possesses four output lines Zi0 to Zi3. Thus the stage VDS1 possesses the output lines Z00 to Z03, the stage VDS2 possesses the output lines Z10 to Z13 and the stage VDSY possesses the output lines ZY0 to ZY3 where $i$ is a whole number.

The output lines Zi0 to Zi3 of each stage VDS of the preliminary decoder circuit VD lead to the post decoder circuit ND. In the latter, the output lines are logic-linked via logic-linking elements to the drive lines X0 to XR leading to the storage cells of the MOS store in such manner that when a specific combination of address signals A is applied, only one drive line X is selected. Here R is $2^n - 1$.

The address signals A are first fed to the address amplifiers AVT. The manner in which an address amplifier AVT of this type can be constructed is shown in FIG. 2. It consists of transistors M1 to M6. The transistor M5 is supplied with the address signal A across its gate. The one controlled electrode of the transistor M5 is connected to the gate terminal of the transistor M6. The other controlled electrode of the transistor M5 and a controlled electrode of the transistor M6 continue to remain connected to a fixed potential VSS. The controlled electrodes of the transistors M3 and M1 are each connected in series to the controlled electrode of the transistor M5, whereas the controlled electrodes of the transistors M4 and M2 are arranged in series with the controlled electrode of the transistor M6. The free controlled electrodes of the transistors M1 and M2 are connected to another fixed potential VDD. The gate terminals of the transistors M3 and M4 are supplied with a transfer timing signal S and the gate terminals of the transistors M1 and M2 are supplied with a pre-charging timing signal SV. The connection point between the transistor M1 and M3 forms the output for the negated, amplified address signal $\bar{A}v$, whereas the connection between the transistor M2 and the transistor M4 forms the output for the amplified address signal A$v$.

The function of the address amplifier illustrated in FIG. 2 will be explained making reference to the pulse train diagram in FIG. 3. Initially the pre-charging timing signal SV is applied. The transistors M1 and M2 are thus conductive and the outputs A$v$ and $\bar{A}v$ are charged to approximately VDD − UT. As the transfer timing signal S is not present, the transistors M3 and M4 are blocked. Thus an address signal A across the transistor M5 does not yet have any effect upon the output A$v$ and $\bar{A}v$ of the address amplifier, but when an address signal A is connected to the transistor M5 the latter is rendered conductive and accordingly the transistor M6 is blocked. Now the pre-charging timing signal SV is disconnected and the transfer timing signal S is switched on. Then the transistors M3 and M4 are rendered conductive whereas the transistors M1 and M2 are blocked. Thus the outputs A$v$ and $\bar{A}v$ can discharge or not discharge in accordance with the address signal A connected to the transistor M5. If, for example, the address signal is such that the transistor M5 is rendered conductive, the output $\bar{A}v$ can discharge via the transistors M3 and M5, whereas when the conditions are the reverse the output A$v$ can discharge via the transistors M4 and M6. Following a transition time, stable conditions occur at the outputs A$v$ and $\bar{A}v$, where the amplified address signal A appears in negated and non-negated form. Then the transfer timing signal S can be disconnected. Expediently the outputs $\bar{A}v$ and A$v$ can be connected to an output stage in which these amplified and negated address signals are intermediately stored. A circuit of this type is disclosed, for example, by the German patent application No. P 24 43 428.4.

The remainder of the description of the Figures has been based upon the assumption that the number of address signals A is $n = 6$, and thus $2^n = 64$ selector lines can be operated. It has also been assumed that $m = 2$ and thus $(n/m) = 3$ stages VDS are formed in the preliminary decoder circuit VD. Each stage VDS then possesses four output lines.

Thus the preliminary decoder circuit VD consists of three stages VDS. FIG. 4 illustrates the structure of a stage VDS. This will be assumed, for example, to be the stage VDS1.

The stage VDS1 in each case consists of 4 NAND gates NG, corresponding to the number of output lines Z00 to Z03 of a stage. Each NAND gate NG is composed of a series arrangement of two transistors and a parallel arrangement of two transistors. The series-connected transistors are to be referred to as discharge transistors, and the parallel-connected transistors are to be referred to as charging transistors. For example, the NAND gate NG1 consists of the discharge transistors M17 and M21 and of the charging transistors M7 and M11. Accordingly the NAND gate NG2 consists of the discharge transistors M15, M22 and of the charging transistors M9, M12. The NAND gate NG3 consists of the discharge transistors M18, M19 and of the charging transistors M8, M13. The NAND gate MG4 consists of the discharge transistors M16, M20 and of the charging transistors M10, M14. The points of connection between the series arrangement and the parallel arrangement of each NAND gate form the output Z. The NAND gate NG1 then possesses the output Z00, the NAND gate NG2 possesses the output Z01, the NAND gate NG3 possesses the output Z02, and the NAND gate NG4 possesses the output Z03.

The gate terminals of the discharge transistors and of the charging transistors are supplied with the amplified address signals in negated or non-negated form. The charging transistors are supplied with two different address signals in negated or non-negated form, whereas the discharge transistors are supplied with the same address signals in negated form. The address signal combinations which are each fed to a NAND gate always differ, however. With two address signals A0 and A1, four different combinations occur and the discharge transistors and charging transistors are operated accordingly. For example, the charging transistor M7 is supplied with the address signal A0, and the charging transistor M11 is supplied with the address signal A1. Then these address signals A0 and A1 are fed to the discharge transistors M17 and M21 in negated form. Consequently the discharge transistor M17 is supplied with the address signal $\overline{A0}$ and the discharge transistor M21 is supplied with the address signal $\overline{A1}$. The address signal combinations fed to the other NAND gates MG can be seen from FIG. 4.

The free end of the series arrangement of the discharge transistors is connected to a fixed potential VSS. The free ends of the parallel arrangement of the charging transistors are connected to a further transistor M23 which is itself connected to a further fixed potential VDD. This further transistor M23 is supplied with the transfer timing signal S.

The function of the stage illustrated in FIG. 4 is as follows. Initially it will be assumed that the stage is supplied with no address signals. It will then be seen from FIG. 2 and FIG. 3 that the potential at the outputs Av and $\overline{A}v$ of the address amplifier is high. Consequently the discharge transistors are all rendered conductive and the outputs Z00 to Z03 are fixed at approximately the potential VSS. At this time the transistor M23 is still blocked. With the transfer timing signal S the outputs of the address amplifier are set in accordance with the prevailing address signal A, the additional transistor M23 is rendered conductive, and the potential VDD is connected to the NAND gates NG.

The result is that, in accordance with the prevailing address signal combination, three outputs Z are connected to a high potential, whereas one output Z remains at a low potential VSS.

If, for example, the address signals A0 and A1 are present, the charging transistors M7, M11 of the NAND gate NG1, the charging transistor M12 of the NAND gate NG2, and the charging transistor M8 of the NAND gate NG3 are rendered conductive. On the other hand, the charging transistors M10 and M14 of the NAND gate NG4 remain blocked. Accordingly the discharge transistors M17, M21 of the NAND gate NG1, the discharge transistor M22 of the NAND gate NG2, and the discharge transistor M18 of the NAND gate NG3 are blocked, whereas the discharge transistors M16 and M20 of the NAND gate NG4 are rendered conductive. Thus a high potential appears at the outputs Z00, Z01, Z02, whereas a low potential remains at the output Z03. Thus one of the four outputs Z is marked, and, in this case, the output which remains at a low potential.

FIG. 4 shows the construction of only one stage VDS of the preliminary decoder circuit VD, although the remaining stages VDS are constructed correspondingly. The only difference is that different address signals are connected to the charging transistors and the discharge transistors. The assignment of the address signals to the individual discharge transistors and charging transistors is carried out as shown in FIG. 4, however.

FIG. 4 illustrates one stage in the event that $m = 2$ address signals are combined in each stage. Then two charging transistors and two discharge transistors are required for every NAND gate. If $m$ exceeds 2, the number of charging transistors and the number of discharge transistors is likewise equal to $m$.

FIG. 5 agains shows the stage illustrated in FIG. 4. However, coupling capacitors CK are connected between the junction of the charging transistors and the additional transistor M23, and the gate terminals of the charging transistors. Thus the potential prevailing across the gate terminals of the charging transistors is raised whenever the transfer timing signal S is switched on. Otherwise the construction of the stage corresponds to that shown in FIG. 4.

Figure 6:
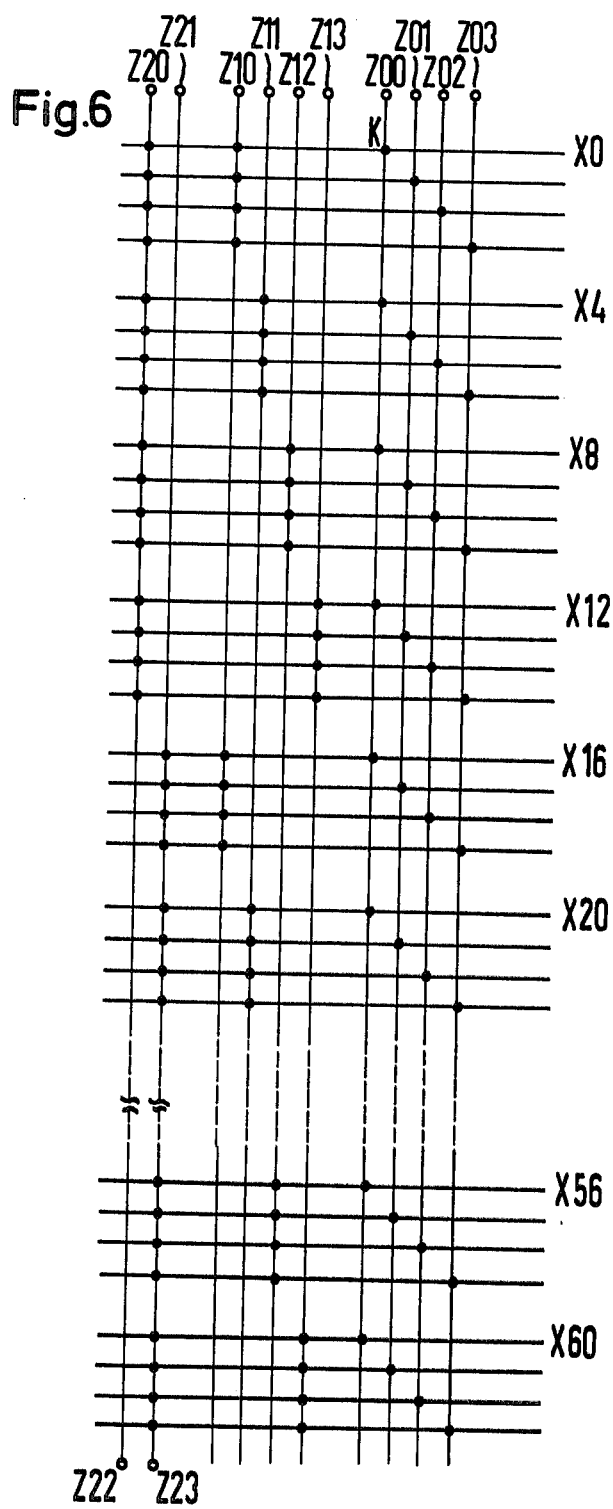
FIG. 6 is a fundamental diagram of a post decoder circuit illustrated in FIG. 1.

FIG. 6 symbolically illustrates the post decoder circuit ND. However, only the output lines Z of the preliminary decoder circuit VD and the drive lines X which lead to the storage cells, have been shown. When a logic link is to be effected between an output line Z and a drive line X, a node K has been shown in FIG. 6. At this point there is arranged a logic-linking element which is operated by a signal on an output line Z and selects a drive line X accordingly. For example, a transistor corresponding to FIG. 7 can be arranged at the location of such a node K, where the gate terminal of this transistor, referred to as decoder transistor DK, is connected to the output line Zik, whereas the controlled path of the decoder transistor DK is arranged between the potential VSS and the drive line XL.

FIG. 6 illustrates three groups each comprising four output lines Z, which must be logic-linked to 64 drive lines X in such manner that each drive line X can be selected via a logic-linking element with a different combination of output lines with respect to each stage. In the exemplary embodiment illustrated in FIG. 6, there are $4^3$ possible combinations, corresponding to the 64 drive lines X.

Figure 7:
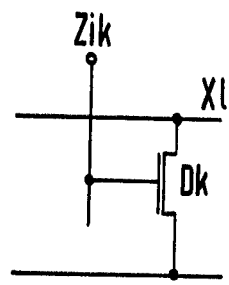
FIG. 7 illustrates a logic-linking element employed in the post decoder circuit of FIG. 6.

Thus each drive line X is logic-linked via three decoder transistors DK to three output lines, each of which leads to a different stage VDS. These decoder transistors DK are connected in parallel with respect to each drive line X, as shown in FIG. 7. The parallel arrangement of the decoder transistors DK can also comprise an output stage which switches through a store selector signal in known manner to the drive line X. This will be the case when all the decoder transistors remain blocked during the operation by the address signals. A corresponding output stage is disclosed for example, in the British Pat. No. 1,375,958.

It can be seen from FIG. 6 that the post decoder circuit ND requires only three decoder transistors DK with respect to each drive line X which is to be selected. In the previous prior art with respect to each drive line X which required to be selected, six transistors were needed with six address signals.

In the exemplary embodiment it has been assumed that $n = 6$ and $m = 2$. If the selection of $n$ and $m$ is such that $n$ cannot be divided by $m$ without a remainder, the remaining address signals are fed not to the preliminary decoder circuit VD, but directly to the post decoder circuit ND. This is again carried out in negated and non-negated form. These remaining address signals in negated and non-negated form are connected with the aid of decoder transistors DK in FIG. 7 in known manner with the other decoder transistors which are selected by the output lines from the stages VDS.

FIG. 6 illustrates a special exemplary embodiment. Naturally it is also possible for $n$ and $m$ to be selected differently, in which case a different number of output lines from the preliminary decoder circuits, a different number of preliminary decoder stages VDS and a different logic linking of the output lines Z to the drive lines X will prevail. However, the requisite plan of procedure will be exactly identical to that which has been described in association with the Figures.

Although various minor modifications may be suggested by those versed in the art, it should be understood that we wish to embody within the scope of the patent warranted hereon, all such embodiments as reasonably and properly come within the scope of our contribution to the art.

We claim as our invention:

1. An arrangement for addressing by use of address signals a MOS store having MOS transistor storage cells comprising: means for amplifying, inverting, and intermediately storing the address signals, means for feeding negated and non-negated address signals to a decoder circuit means, drive lines connecting the decoder circuit to the storage cells, said decoder circuit means selecting a drive line in dependence upon prevailing address signals, said decoder circuit means comprising a preliminary decoder circuit and a post decoder circuit, said preliminary decoder circuit including a plurality of stages; for $n$ address signals, means for supplying each of said plurality of stages with $m$ different address signals in negated and non-negated form such that $(n/m)$ stages are provided; each stage having $2^m$ output lines; means for marking the output lines of each stage in dependence upon address signal combinations prevailing at the stages; output lines of the stages being connected to the post decoder circuit; the post decoder circuit having $2^n$ drive lines which connect to the storage cells; said post decoder circuit having logic-linking element means for logic-linking the drive lines to the output lines of the stages in such manner that each drive line can be selected by a different combination of an output line with respect to each stage via a logic-linking element; and means for feeding the remaining address signals to the post decoder circuit in negated and non-negated form in the event that the $n$ address signals are divisible by $n$ with a remainder, the drive lines being selected by said remaining address signals via logic-linking elements.

2. An arrangement as claimed in claim 1, characterized in that each logic-linking element comprises at least one transistor of the preliminary decoder circuit whose gate is connected to an output line from a stage, and whose controlled path is arranged between a drive line and a fixed potential.

3. An arrangement as claimed in claim 1, characterized in that each stage of the preliminary decoder circuit comprises $2^m$ NAND gates, that each NAND gate is composed of $m$ series connected discharge transistors and $m$ parallel connected charging transistors, a junction of the parallel connected charging transistors and the series connected discharge transistors being connected to an output line of the stage, gate terminals of the charging transistors each being supplied with $m$ different address signals in negated or non-negated form, gate terminals of the discharge transistors being supplied with the $m$ different address signals in negated form, and an additional transistor being provided whose controlled path lies between a junction of the charging transistors and another fixed potential which is rendered conductive by a transfer timing signal when the address signals are analyzed.

4. An arrangement as claimed in claim 3, characterized in that a coupling capacitor is in each case arranged between a junction of the additional transistor and the charging transistors and inputs for the negated and non-negated address signals to the gate terminals of the charging transistors.

* * * * *